United States Patent
Tessler et al.

(10) Patent No.: US 10,497,789 B2
(45) Date of Patent: Dec. 3, 2019

(54) ELECTRONIC DEVICE

(71) Applicant: TECHNION RESEARCH & DEVELOPMENT FOUNDATION LIMITED, Haifa (IL)

(72) Inventors: Nir Tessler, Zichron Jacob (IL); Ariel Jacques Ben Sasson, Haifa (IL); Michael Greenman, Haifa (IL)

(73) Assignee: Technion Research & Development Foundation Limited, Haifa (IL)

( * ) Notice: Subject to any disclaimer, the term of this patent is extended or adjusted under 35 U.S.C. 154(b) by 5 days.

(21) Appl. No.: 15/936,513

(22) Filed: Mar. 27, 2018

(65) Prior Publication Data

US 2018/0219074 A1    Aug. 2, 2018

Related U.S. Application Data

(62) Division of application No. 15/100,689, filed as application No. PCT/IL2014/051066 on Dec. 7, 2014, now Pat. No. 9,960,239.

(30) Foreign Application Priority Data

Dec. 20, 2013 (IL) .......................................... 229837

(51) Int. Cl.
*H01L 29/786* (2006.01)
*H01L 29/417* (2006.01)
(Continued)

(52) U.S. Cl.
CPC .... *H01L 29/41741* (2013.01); *H01L 29/0847* (2013.01); *H01L 29/456* (2013.01);
(Continued)

(58) Field of Classification Search
None
See application file for complete search history.

(56) References Cited

U.S. PATENT DOCUMENTS

| 7,923,720 B2 | 4/2011 | Obata et al. |
| 2002/0008464 A1* | 1/2002 | Christensen .......... H01L 27/308 313/498 |

(Continued)

FOREIGN PATENT DOCUMENTS

| CN | 1476111 A | 2/2004 |
| CN | 101401224 A | 4/2009 |

(Continued)

OTHER PUBLICATIONS

International Search Report from a counterpart foreign application—PCT/IL2014/051066—dated Apr. 15, 2015—three pages.

(Continued)

*Primary Examiner* — Ali Naraghi
(74) *Attorney, Agent, or Firm* — Roach Brown McCarthy & Gruber, P.C.; Kevin D. McCarthy

(57) ABSTRACT

A transistor structure is configured as a vertical type transistor. The transistor structure has a patterned electrode located between a gate electrode and a channel region of the transistor structure. The patterned electrode has one or more regions of discontinuity of the electrode. The patterned source electrode has at least two layers having at least a first and second barriers for injection of charge carriers into the channel region. The patterned electrode is configured such that a second layer having a second, higher, barrier for injection of charge carriers is configured to provide a physical barrier for flow of charge carriers from the electrode into the channel region.

12 Claims, 10 Drawing Sheets

(51) Int. Cl.
  *H01L 51/05*    (2006.01)
  *H01L 51/10*    (2006.01)
  *H01L 29/08*    (2006.01)
  *H01L 29/45*    (2006.01)
  *H01L 29/78*    (2006.01)
  *H01L 29/861*   (2006.01)

(52) U.S. Cl.
  CPC ........ *H01L 29/7827* (2013.01); *H01L 29/861* (2013.01); *H01L 51/057* (2013.01); *H01L 51/105* (2013.01)

(56) References Cited

U.S. PATENT DOCUMENTS

| | | | |
|---|---|---|---|
| 2004/0012017 A1 | 1/2004 | Nagayama | |
| 2005/0057136 A1* | 3/2005 | Moriya | H01L 51/0021 313/311 |
| 2005/0263756 A1 | 12/2005 | Yasunami et al. | |
| 2006/0054883 A1 | 3/2006 | Hanna et al. | |
| 2006/0237731 A1* | 10/2006 | Furukawa | H01L 51/105 257/83 |
| 2010/0244710 A1* | 9/2010 | Obata | H01L 51/5296 315/167 |
| 2012/0097949 A1* | 4/2012 | Tessler | B82Y 10/00 257/57 |
| 2013/0009135 A1 | 1/2013 | Katsuhara | |

FOREIGN PATENT DOCUMENTS

| | | |
|---|---|---|
| WO | 2005/091376 A1 | 9/2005 |
| WO | 2007080575 A1 | 7/2007 |
| WO | 2010113163 A1 | 10/2010 |
| WO | 2012/078759 A2 | 6/2012 |

OTHER PUBLICATIONS

Written Opinion of the International Searching Authority from a counterpart foreign application—PCT/IL2014/051066—dated Apr. 15, 2015—five pages.
Search Report from a foreign patent office in a counterpart foreign application (Chinese application No. 100055), dated Feb. 2, 2018, 2 pages.

* cited by examiner

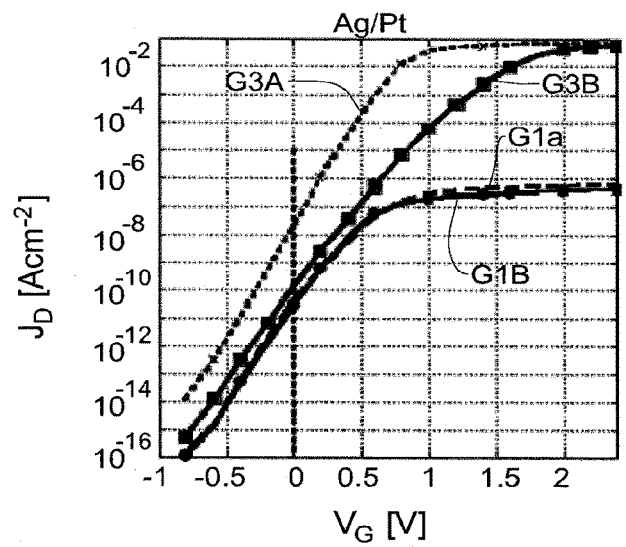
FIG. 6
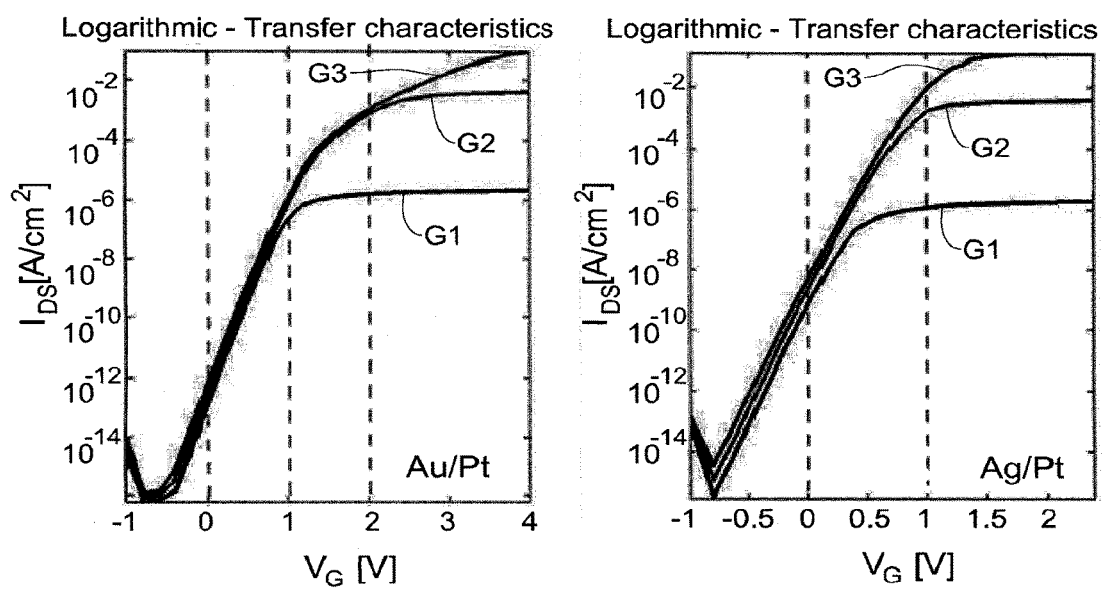
FIG. 7A
FIG. 7B

ELECTRONIC DEVICE

TECHNOLOGICAL FIELD

The invention is in the field of structured electrodes for electronic devices, and is particularly useful for vertical type transistor structures or diodes.

BACKGROUND

Various types of electronic devices utilize material selection to provide desired charge transmission and injection properties for proper operation. Typically, charge carriers, such as electrons or holes, may be injected from a conducting/metallic electrode into semiconductor elements of the device to thereby provide adjustable electric transmission properties for applications such as switching, current rectifying, etc.

Generally, two main types of conductor-semiconductor electrical contact are used, Ohmic contact and Shottky contact. The contact behavior is generally determined by electrical properties of the metal electrode and the semiconductor, and at time by geometry or other characteristics of the metal-semiconductor junction.

Various electrode structures are known, being configured to provide desired charge injection properties. For example, WO 2010/113,163, assigned to the assignee of the present application, presents an electronic device, being configured for example as a vertical field effect transistor. The device comprises an electrically-conductive perforated patterned structure which is enclosed between a dielectric layer and an active element of the electronic device. The electrically-conductive perforated patterned structure comprises a geometrical pattern defining an array of spaced-apart perforation regions electrically conductive regions. The pattern is such as to allow the active element of the electronic device to be in contact with said dielectric layer aligned with the perforation regions. A material composition of the device and features of said geometrical pattern are selected to provide a desired electrical conductance of the electrically-conductive perforated patterned structure and a desired profile of a charge carriers' injection barrier along said structure.

GENERAL DESCRIPTION

As described above, repeatable selected performance of electronic devices relies on appropriate control over charge injection properties between elements of the device. Thus, there is a need in the art for a novel electrode structure capable to provide appropriate tailoring of charge injection properties between the electrode and a semiconductor elements being in electrical contact therewith.

The present invention provides an electrode structure, suitable for use in an electronic device and configured to provide desired charge injection properties. The electrode structure is configured with at least two groups of electrode portions where a first group of regions is configured with high injection properties (low barrier for injection) and a second group of regions is configured with lower injection properties (higher barrier for injection). In this configuration, charge carriers are typically transmitted from regions of the first group into an adjacent semiconductor element. Additionally, charge injection properties of the electrode structure are adjusted by providing the electrode structure with a geometrical configuration such that regions of the second group provide physical or geometrical blockage for charge transmission from regions of the first group into the semiconductor element and towards a target element (e.g. to a drain electrode in the case of diode of transistor structure).

More specifically, the electrode structure is generally made of electrode portions comprising electrode portions of at least two materials, having first and second different charge injection properties with respect to a third (semiconductor) material of the semiconductor element. The relative arrangement of first and second groups of regions, made of the first and second materials respectively within the electrode structure, provides that charge carriers injected from regions of the first group into the semiconductor element interact with regions of the second group before being freely transmitted into the semiconductor element bulk volume. To this end, the arrangement of the first and second groups of electrode portions within the electrode structure cause re-absorption of a portion of the charge carriers emitted from regions of the first group into regions of the second group. This phenomenon effectively reduces or at least affects the charge injection properties of the electrode structure. Therefore, appropriate design of the electrode structure provides for tailoring of desired charge injection properties of the electrode structure which may be different than the actual injection properties of each of the first and second materials separately.

To provide the desired geometry, the electrode structure may be configured as a patterned electrode structure. More specifically, a surface of the electrode structure may be configured to provide certain discontinuity in electrical characteristics therealong. The surface of the electrode structure may thus be configured as a non-simply connected surface and the electrode structure has holes or missing portions along its surface.

Thus, according to one broad aspect, the present invention provides an electronic device comprising an electrode structure located in electrical contact with a semiconducting element. The electrode structure is configured with two or more groups of regions/layers comprising regions of a first group having first charge injection properties and regions of a second group having second charge injection properties being lower than the first charge injection properties. The regions of the second group are configured to provide geometrical harrier for injection of charge carriers from regions of the first group into the semiconductor element. According to some embodiments, the electrode structure comprises at least first and second layers, a first layer comprising regions of the first group and a second layer comprising regions of the second group. Additionally one or more of the first and second layers may be configured as a multi-layered structure, said multi layered structure comprising at least two of a conducting layer, semiconducting layer, and an insulating layer.

The electronic electrode structure may be configured as a patterned electrode, comprising one or more regions of discontinuity in electrical conductivity along a surface of the electrode structure. Said one or more regions of discontinuity of the electrode structure may be configured as one or more holes along surface of the electrodes. The regions of discontinuity of the electrode structure may be configured such that regions of the second group skirts over the edges of the regions of the first group. Generally, at least one region of the second group may cover at least one region of the first group. Alternatively, the regions of the second group may block portions of the regions of the first group while leaving certain portions thereof with direct contact to the semiconductor element. According to some embodiments of the invention, the electrode structure may be configured to have step-source, tilted edge or curved geometry in at least one discontinuity region. In the case of a curved geometry, it may be convex or concave.

According to some embodiment, electrode portions of the first groups of the electrode structure may be configured from a conducting material selected from: Li, Ca, Mg, Al, Ag, ZnO, Au. Additionally, electrode portions of the second group may he configured from a conductive material selected from: Al, Ag, Au, MoO3, Pt, Se. Alternatively, material selection for electrode portions of the first and second groups may be reversed for use in electrode structure according to the present invention configured for transmission of hole (other than transmission of electrons), thus, electrode portions of the first group may be configured from: Al, Ag, Au, MoO3, Pt, Se, and electrode portions of the second group may be configured from: Li, Ca, Mg, Al, Ag, ZnO, Au. The conducting material may also be a doped semiconductor with appropriately selected work function.

It should be noted that electrode portions of the first or second groups may be multi-layers electrode portions. More specifically, each layer of the first and/or second electrode portions may be a multilayered structure comprising at least one conducting sub-layer configured of any one of the materials specified above. Additional layers may comprise an insulating layer and/or semiconducting layer. Generally, the sub layers may be arranged such that an insulating sub layer is located between the conducting layers of the first and second electrode portions to thereby prevent current leakage between the electrode portions. Additionally, an insulating layer may be located at an interface of the electrode portions of the second groups thereby reducing current transmission at such interfaces.

According to some embodiments, the electrode structure may be configured as a layered electrode structure comprising a first layer being of the first group and a second layer being of the second group. The second layer is attached to at least one surface of the first layer.

The electronic device utilizing the electrode structure of the present invention may be diode or a transistor structure. The electrode structure may be a source electrode of said diode or transistor structure. The electronic device may be configured as a vertical type transistor structure. To this end, the electrode structure may be configured as a patterned electrode structure and to be operable as a source electrode. The semiconductor element may be operable as a channel element of the transistor structure.

According to yet another broad aspect of the present invention there is provided a transistor structure configured as a vertical type transistor. The transistor structure comprises a patterned electrode located between a gate electrode and a channel region of the transistor structure. The patterned electrode comprises one or more regions of discontinuity of said electrode, and comprises at least two layers having at least first and second barriers for injection of charge carriers into the channel region. The patterned electrode is configured such that a second layer having a second, higher, barrier for injection of charge carriers is configure to provide a physical barrier for flow of charge carriers from the electrode into the channel region. According to some embodiments, the patterned electrode may be a source electrode of the transistor structure. Additionally, the patterned electrode may be configured as a two layered electrode.

According to some embodiments, the patterned electrode may be configured as a multi layered electrode, comprising at least two layers of conducting material.

According to some embodiments of the invention, said one or more regions of discontinuity of the patterned electrode may be configured as one or more holes along surface of the electrodes, thereby allowing penetration of electric field generated by the gate electrode into the channel region.

According to yet another broad aspect, the present invention provides an electrode structure for use in electronic device. The electrode structure comprises at least first and second groups of electrode portions having first and second charge injection properties respectively. Geometrical arrangement of the electrode portions of the second group, having lower charge injection properties, is configured to provide physical barrier for transmission of charge carrier from electrode portions of the first group having higher charge injection properties.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 2A-2G illustrate transistor structure configurations and FIG. 2H illustrates a diode configuration;

FIG. 6 illustrates a comparison between electronic performance of conventional patterned Ag/Pt source electrode and step-source Ag/Pt electrode according to the invention; and FIGS. 7A and 7B show simulated source-drain current density for vertical type transistor structure utilizing respectively tilted edge Au/Pt and Ag/Pt source electrode according to the present invention.

DETAILED DESCRIPTION OF EMBODIMENTS

Figure 1:
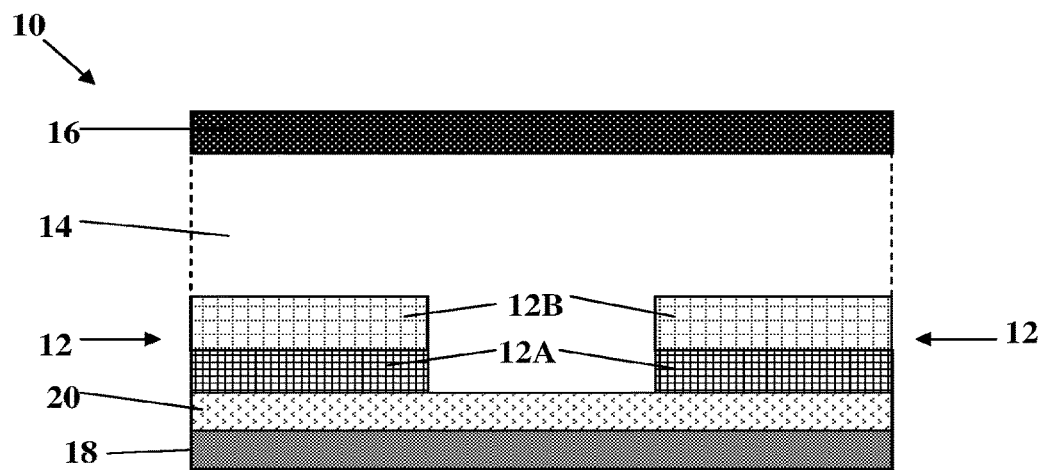
FIG. 1 exemplifies a transistor structure utilizing two-layered patterned electrode according to the conventional configuration.

Reference is made to FIG. 1, illustrating an example of transistor structure 10 configured as described in WO 2010/113,163 (assigned to the assignee of the present invention). As shown, the transistor structure 10 is configured as a vertical type transistor and includes source and drain electrodes 12 and 16 and a channel region 16 located therebetween. Additionally, the transistor includes a gate electrode 18 located under the source electrode 12 and separated therefrom by an isolating (dielectric) layer 20. It should be noted that the source and drain electrodes may be replaced between them.

As shown, the electrode located close to the gate electrode 18, in this example the source electrode 12, is patterned to allow electric field to penetrate into the channel region 14 to thereby increase its effect on charge carrier's mobility through the channel 14. Additionally, the patterned source electrode 12 is formed of two layers 12A and 12B made of different materials having selected different charge injection properties with respect to the channel region 14. Generally, the bottom portion of the source electrode 12A is made of material having high charge injection properties and the top portion 12B is made of material having lower charge injection properties.

In this connection it should be noted that charge injection properties can generally be defined by the work function or Fermi energy level of a specific injecting material, relative to the energy level of the accepting material into which the charge is injected. The lower the difference in energy level of the materials, the lower the energy gap for charge carriers to "escape" the material, i.e. transfer from one material to the other, and thus the higher the charge injection properties and vice versa.

The present invention provides an electrode structure, configured to provide increased variability of effective charge carriers' injection utilizing geometrical structure of electrode regions/portions of at least two groups having different injection properties. This allows fine tuning of the effective injection properties of the electrode structure thereby enabling to provide a desired affinity for charge injection.

Figure 2A:
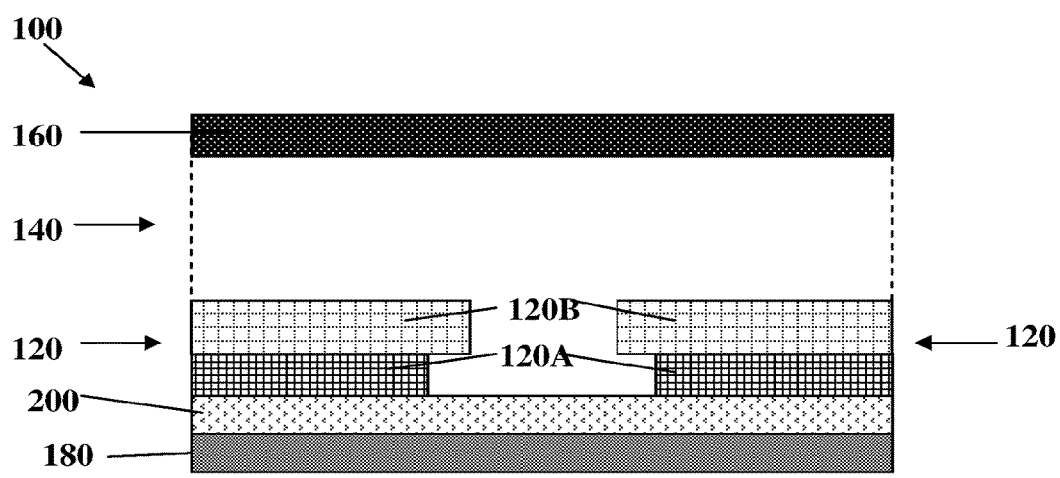
FIGS. 2A to 2H exemplify configurations of electronic devices utilizing an electrode structure according to embodiments of the present invention.
Figure 2B:
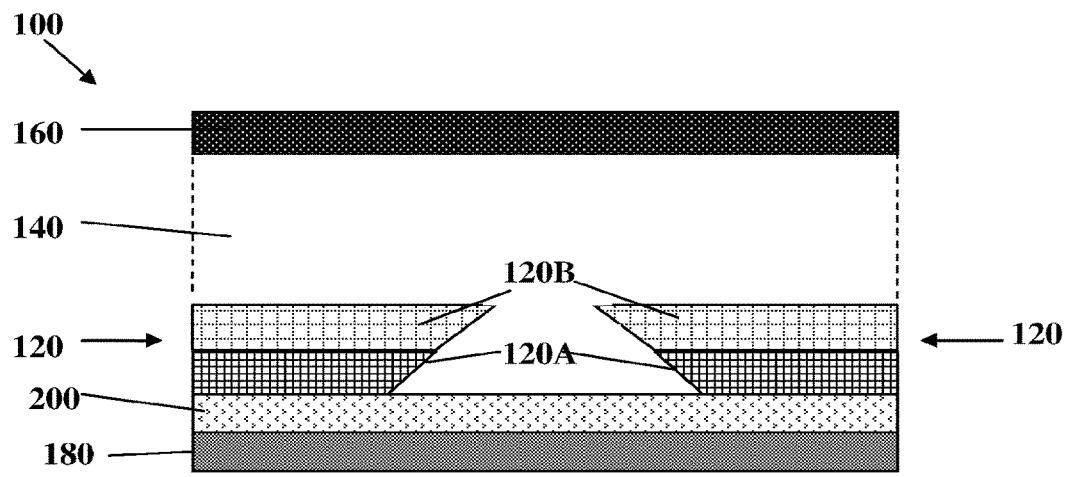
Figure 2C:
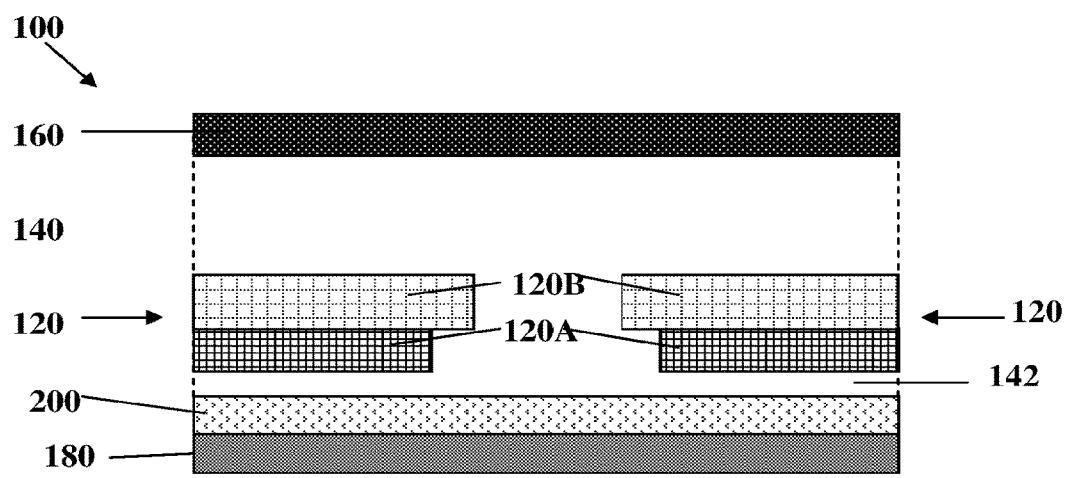
Figure 2D:
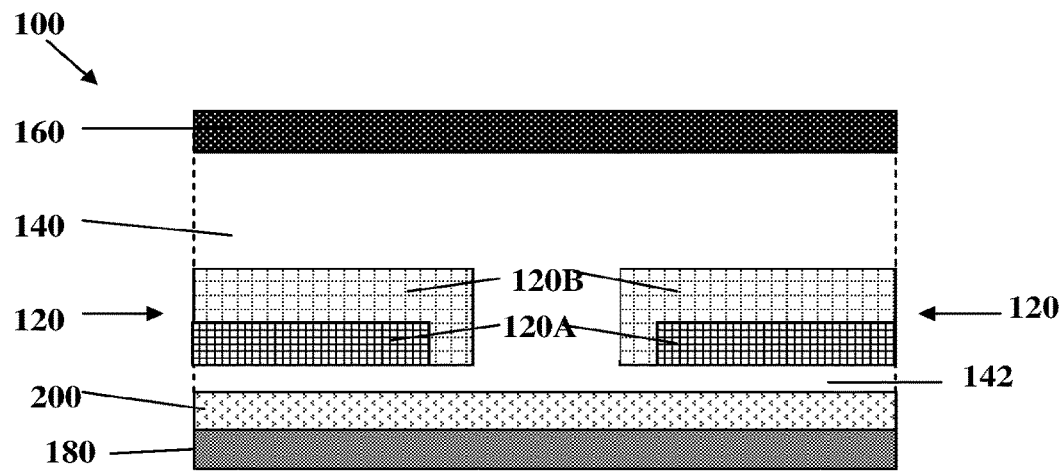
Figure 2E:
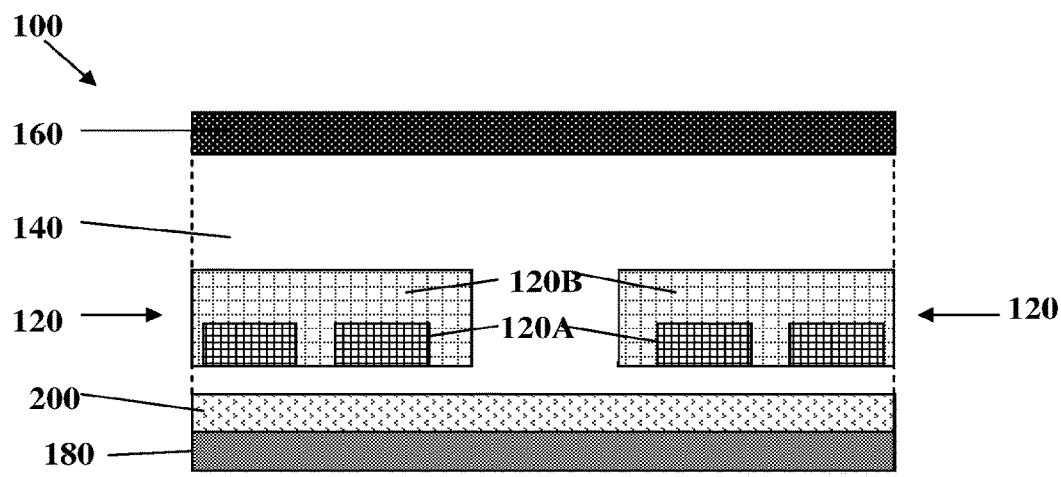
Figure 2F:
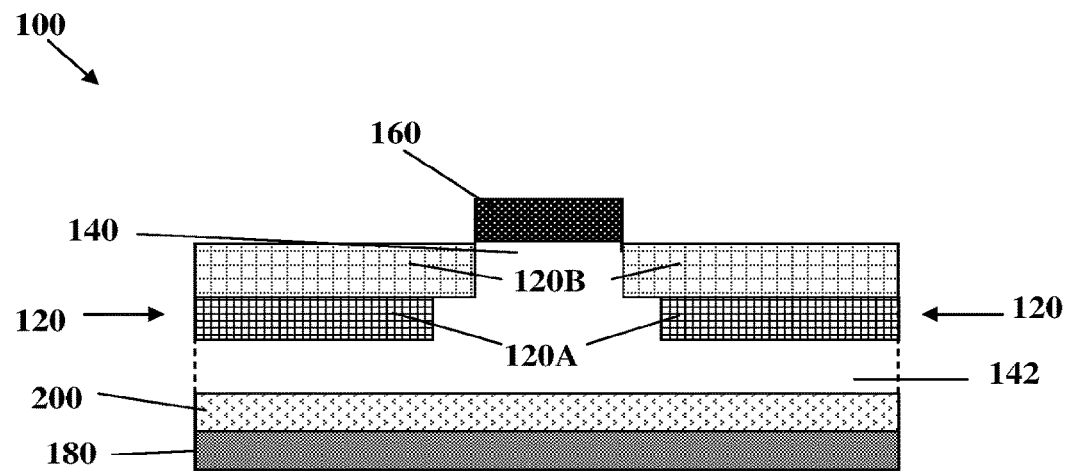
Figure 2G:
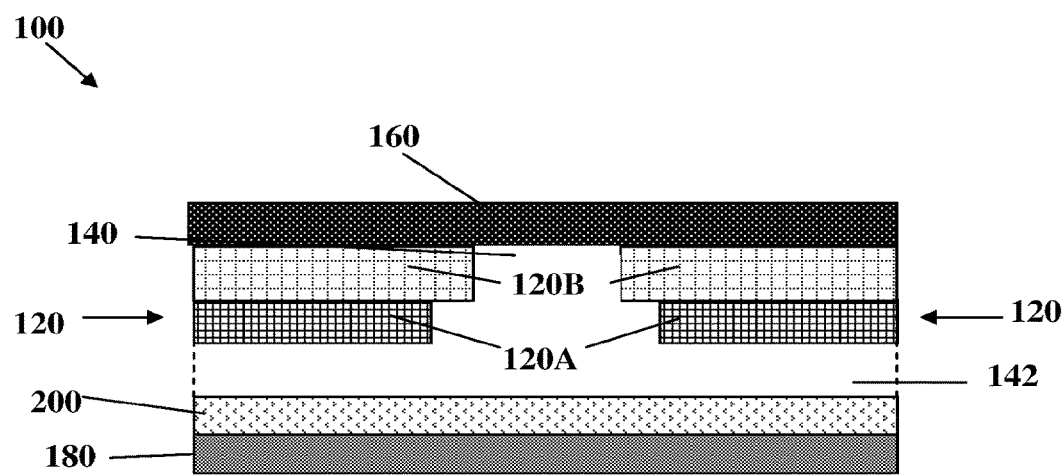
Figure 2H:
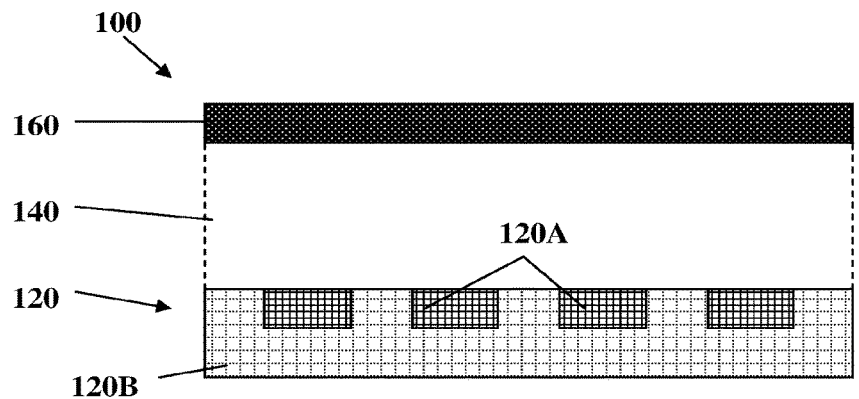

Reference is made to FIGS. 2A-2H illustrating several configurations of an electronic device 100 utilizing an electrode structure 120 according to the present invention. FIGS. 2A-2G illustrate five transistor structure configurations and FIG. 2H illustrates a diode configuration. It should be noted that the electrode structure according to the present invention is suitable for use in various electronic devices utilizing current transmission from a conducting electrode (e.g. metallic) into a semiconductor element and thus should be interpreted accordingly with respect to transistor structures, diodes and other electronic devices.

More specifically, the transistor structures 100 illustrated in FIGS. 2A-2G are configured as a vertical type transistor structures and include a patterned source electrode 120, channel region 140, drain electrode 160 and a gate electrode 180 being separated from the source electrode 120 and/or the channel region 140 by an dielectric layer 200 configured to isolate the gate 180 from the channel 140.

Thus, the electronic device 100, which may be used e.g. as a transistor structure or as a diode structure, utilizes an electrode structure 120 configured with at least two groups of regions 120A and 120B having first and second charge injection properties. More specifically, the first and second groups of regions are made of materials having different work functions, such that a Fermi level of the material of regions 120A is closer to the relevant semiconductor level (higher charge injection properties) while the difference between Fermi level of the material of regions 120B and that of the semiconductor element is higher providing lower charge injection properties. The electrode structure 120 is configured such that regions 120B provide a both physical (geometric) and electronic barrier for passage of charge carriers from electrode portions of regions 120A into the volume of the channel region 140 and towards the drain 160.

As exemplified in FIG. 2A, the electrode structure may be configured as a layered electrode having at least two layers 120A and 120B and may be configured as a patterned electrode having regions of discontinuity in electrical conductivity along its surface. This will be described in more details below, with reference to FIGS. 3A-3B. Additionally, the top layer 120B, having low charge injection properties, is configured to skirt over the edges of the bottom layer 120A to thereby cause interaction with charge carriers emitted from electrode portions 120A into semiconductor element 140 (e.g. channel). This interaction provides effective barrier for charge carriers passage into the semiconductor element 140 (e.g. channel). This step-source geometry of the electrode structure 120 allows for desired selection of charge injection properties. Additionally, due to the better charge injection properties of the regions of the first group (bottom layer) 120A, which may even provide an Ohmic contact with the semiconductor element 140, charge carriers will be transmitted into the semiconductor 140 from these regions rather than from the regions of the second group (top layer) 120B. However, the transmitted charge carriers are propagating into the semiconductor elements 140 and are being directed towards an electrically conductive element such as the drain electrode 160. Thus, the physical location of the top layer 120B of the patterned electrode 120 partially block passage of charge carriers, and even absorbs a portion of the charge carriers passing nearby, thereby increasing an effective barrier for charge injection from the patterned electrode 120.

As indicated above, the top layer 120B (second group) of the electrode structure may be configured to overflow over the edges of the bottom layer 120A (first group). Additional configurations may provide an angled cut of edges of the electrode structure at its regions of discontinuity (e.g. holes, edges of electrode regions) as shown in FIG. 2B illustrating a tilted face source geometry of the electrode structure 120. Alternative, configuration is shown in FIG. 2C, showing an additional step-source geometry where a portion 142 of the semiconductor element 140 separates the patterned electrode structure 120 from the dielectric layer 180. This allows higher surface area of electrode portion 120A to be exposed and used for charge injection into the semiconductor element 140. It should be noted that in this configuration, charge carriers being injected into the semiconductor element 140 still pass close to the top electrode portion 120B and a portion thereof may be absorbed therein, thus current transmission between the electrode structure 120 and the semiconductor element 140 is determined in accordance with an effective barrier for charge injection due to the geometrical configuration of the electrode structure.

Two additional examples of the electronic device 100 and the electrode structure 120 configurations are shown in FIGS. 2D and 2E. In these configurations, the electrode structure is configured of electrode portions 120A, having lower barrier for charge injection, being covered by electrode portions 120B having higher barrier for charge injection. As shown, the injecting electrode portions 120A are configured to have certain interface region with the semiconductor element 140 to allow charge injection thereto, while the barrier portions 120B are arranged such as to provide geometric barrier for charge transmission along the semiconductor element.

Some additional configurations are exemplified in FIG. 2F and 2G. These configurations of the transistor structure 100 utilize a multi-layer arrangement of at least one of the first or second electrode portions 120A or 120B. As shown, the drain 160 is located directly on top of the second electrode portion 120B using only the spaces above the semiconductor channel 140 (FIG. 2F) or located on top of the second electrode portion 120B along the structure (FIG. 2G). In such configurations, at least one of the electrode portions is a multi-layer structure including at least one insulating layer. The insulating layer is located on top of a conducting layer of the electrode. Such multi layered structure is exemplified and described in more details with reference to FIG. 3A.

As indicated above, FIG. 2H exemplifies an electronic device 100, configured as a diode structure (e.g. Schottky diode). The device 100 includes an electrodes structure 120 according to the present invention, a semiconductor element 140 being in electrical contact with the electrode structure 120, and a drain electrode 160 being in electrical contact with the semiconductor element 140. As shown, the electrode structure 120 includes two groups of electrode portions, electrode portions 120A have low barrier for charge injection to the semiconductor element 140, and electrode portion(s) 120B have higher barrier for charge injection. It should also be noted that the low-barrier electrode portions 120A may face the opposite surface of the electrode structure 120, however in this configuration, electrode portions 120A should have contact with the semiconductor element 140 as shown e.g. in FIG. 2E. Additionally, when used as a diode structure (or any other device type such as lateral transistor structure) the semiconductor element 140 of the electronic device 100 may be formed of one or more layers or sub-layer of semiconductor materials having different electrical properties. Thus the semiconductor element may be configured to provide a gradient of electrical properties to thereby allow desired operation of the device.

Figure 3A:
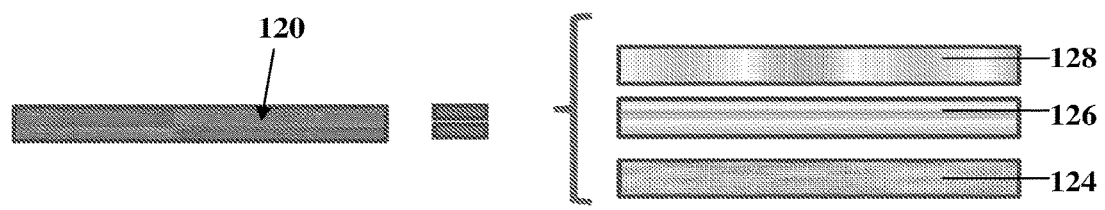
FIGS. 3A and 3B exemplify different configurations of the electrode portions (FIG. 3A) and relative configurations of the electrode portions at discontinuity regions (FIG. 3B) according to embodiments of the present invention.
Figure 3B:
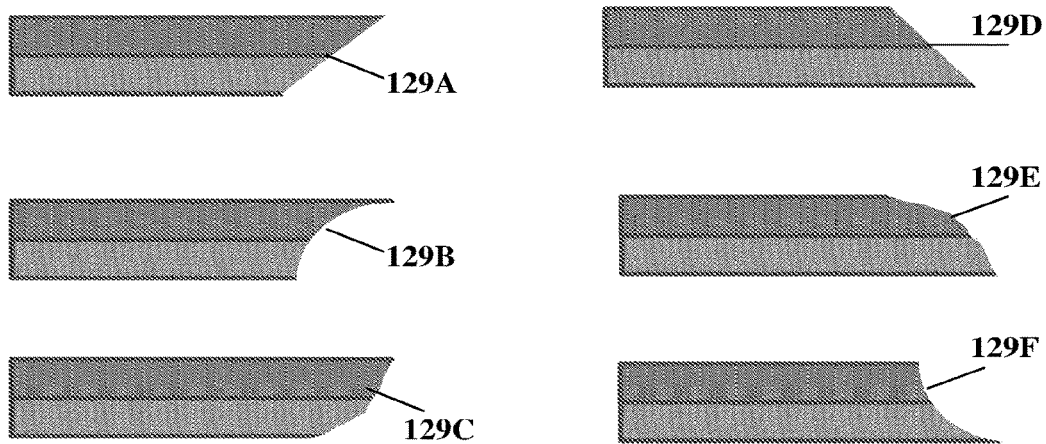

As indicated above, various configurations of the electrode portions and/or interface therebetween may be used to provide the desired charge injection properties. Reference is made to FIGS. 3A and 3B exemplifying configurations of the electrode portions (FIG. 3A) and interface between the electrode portions (FIG. 3B). As shown in FIG. 3A, any one of the first and second electrode portions (generally at 120) may be a multi-layered structure. Such multi layered structure may include two or more layers including at least one layer of electrically conducting material 124, and may include additional layers of insulating and/or semiconducting materials. As exemplified in the figure a multi layered structure may include a first conducting layer 124, a second semiconducting layer 126 and a third insulating layer 128. It should be noted that a sequence of these sub-layers is generally selected in accordance with fabrication demands as well as desired electronic properties of the device. The sub-later sequence may also vary to fine tune the multi-layer properties. Alternatively, the multi layered structure may be a bi-layer structure having a first conducting layer 124 and a second insulating layer 128. This provides insulating between the first and second electrode portions and/or between the second electrode portion and the channel (or the drain electrode as shown in FIG. 2G).

FIG. 3B illustrates six variations of interface structure between the first and second electrode portions. Interface structures 129A-129C show that the second electrode portions skirt over the first electrode portion to provide blocking and re-absorbing of charge carriers transmitted therefrom. Alternatively, in interface structures 129D-129F the second electrode portions are configured to allow direct charge carriers' transmission from the first electrode portions and into the channel region. It should he noted that such interface structure may provide additional current transmission and may be used for proper tailoring of transmission propertied of the transistor structure to meet the desired properties.

Figure 4A:
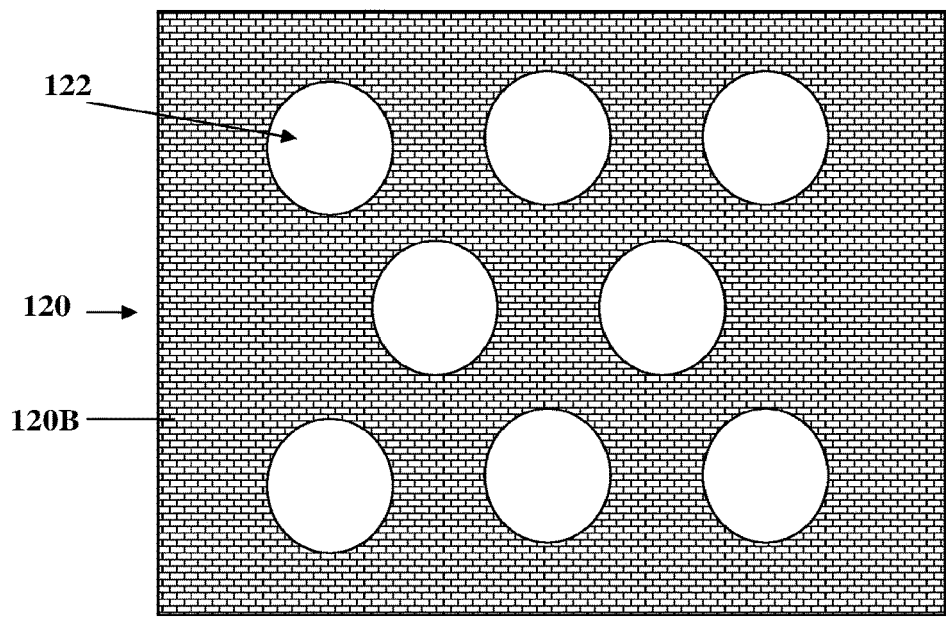
FIG. 4A to 4C illustrate surface geometry of electrode structure according to certain embodiments of the present invention, the electrode structure is illustrated with circular holes (FIG. 4A), rectangular holes (FIG. 4B) and a bottom view of the electrode having rectangular holes (FIG. 4C)
Figure 4B:
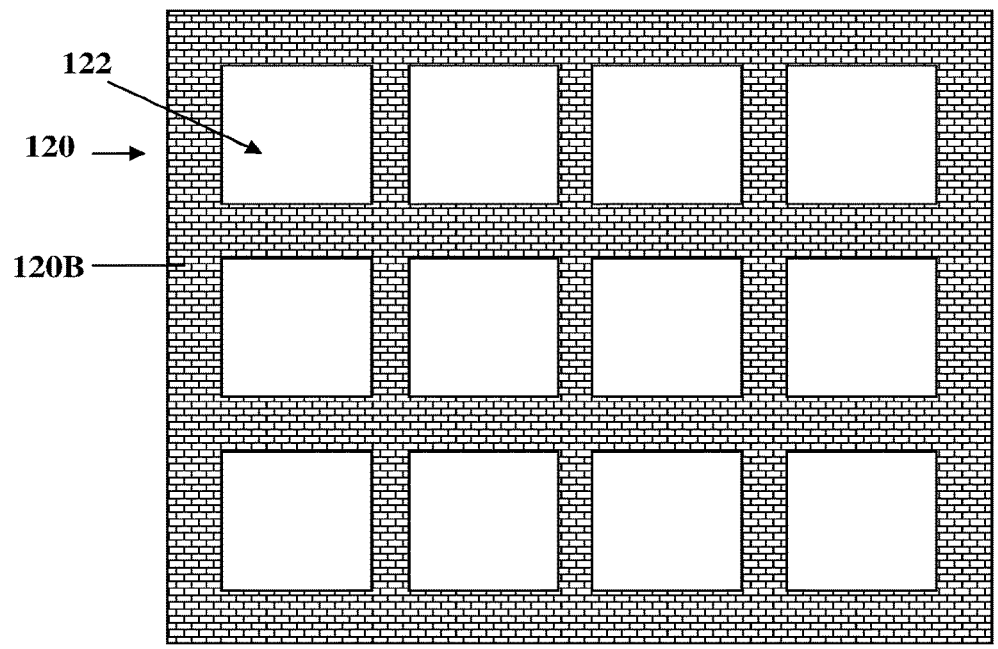
Figure 4C:
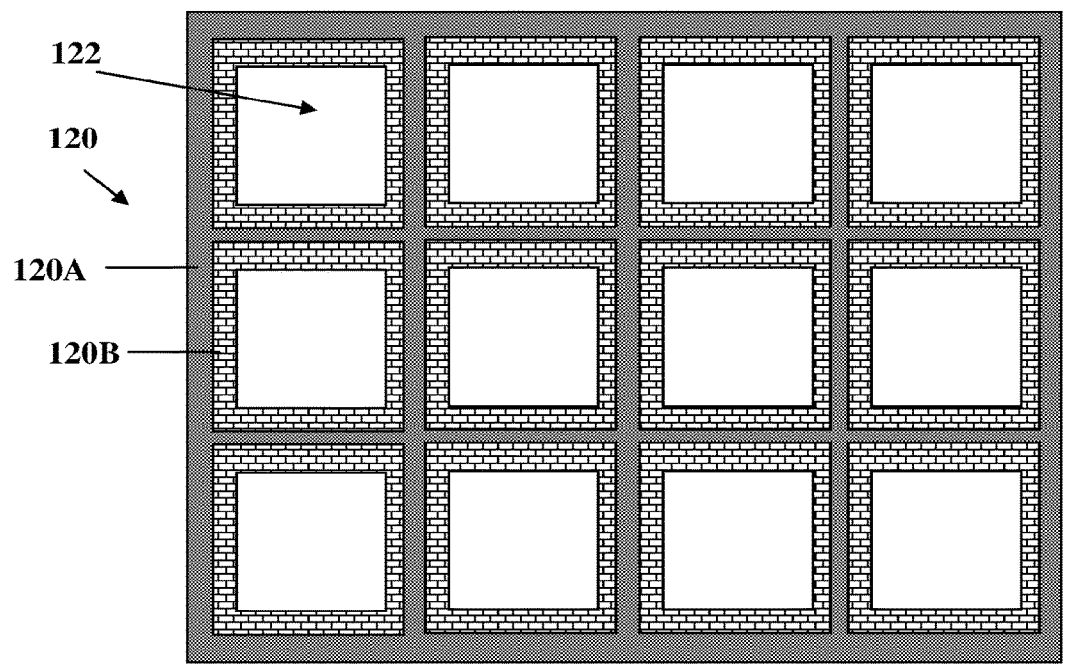

Reference is made to FIGS. 4A-4C illustrating a top and bottom views of two configurations of the patterned electrode structure 120. As described above, the electrode structure is configured such that a surface of the electrode facing the direction of preferred charge carriers' propagation within the electronic device is not a simply connected surface. Thus, the electrode structure 120 has structural discontinuity along its surface. As shown, the electrode structure 120 has one or more regions of discontinuity 122 along its surface. These regions may be of any geometrical shape, circular regions are exemplified in FIG. 4A and rectangular regions are exemplified in FIG. 4B, and may be arranged in an ordered or disordered fashion along the surface of the electrode 120. It should however be noted that any geometrical arrangement of discontinuity regions may be suitable for the present invention. However injection of charge carriers into the semiconductor element 140 may be affected by relative interface area of electrode portions 120A and the semiconductor element as well as an effective trajectory for passage of charge carriers away from the electrode structure 120.

FIG. 4C exemplifies the electrode structure 120 configuration with rectangular regions of discontinuity, from the side thereof that faces the dielectric layer 180. As shown, at the edges of discontinuity regions 122, the top layer 120B overflows, and skirts over the borders of the bottom layer 120A. This limits the effective area for charge injection, as well as provides a physical/geometric harrier for charge carriers' passage towards the volume of the semiconductor element 140 and the drain electrode 160.

Figure 5A:
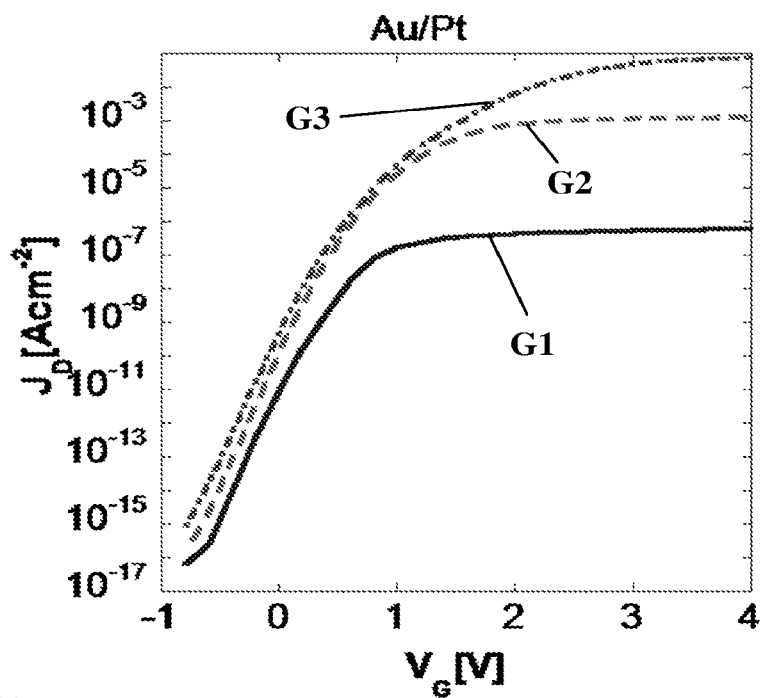
FIGS. 5A to 5D show simulated source-drain current density for vertical type transistor structure utilizing conventional Au/Pt patterned source electrode (FIG. 5A), step-source structure Au/Pt electrode according to the invention (FIG. 5B), conventional Ag/Pt patterned source electrode (FIG. 5C) and step-source structure Ag/Pt electrode according to the invention (FIG. 5D)
Figure 5B:
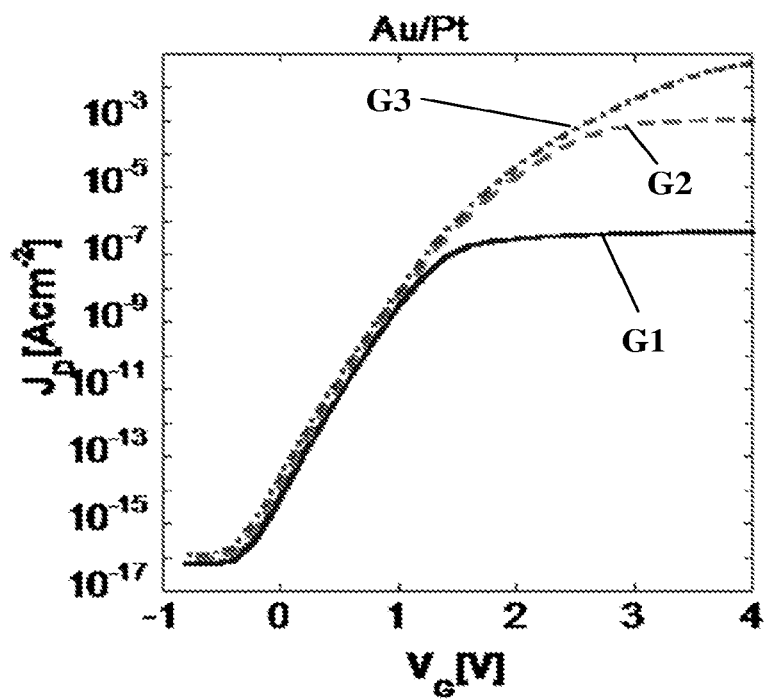
Figure 5C:
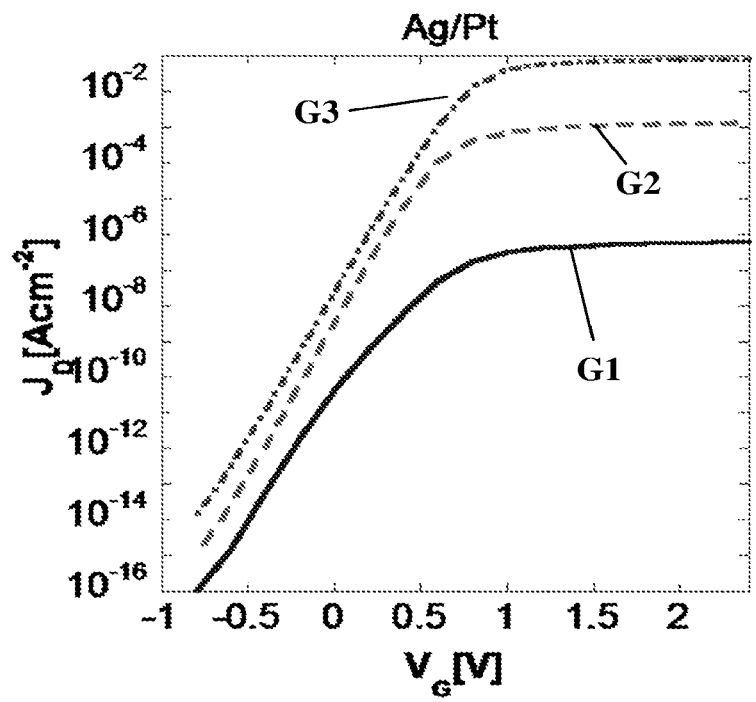
Figure 5D:
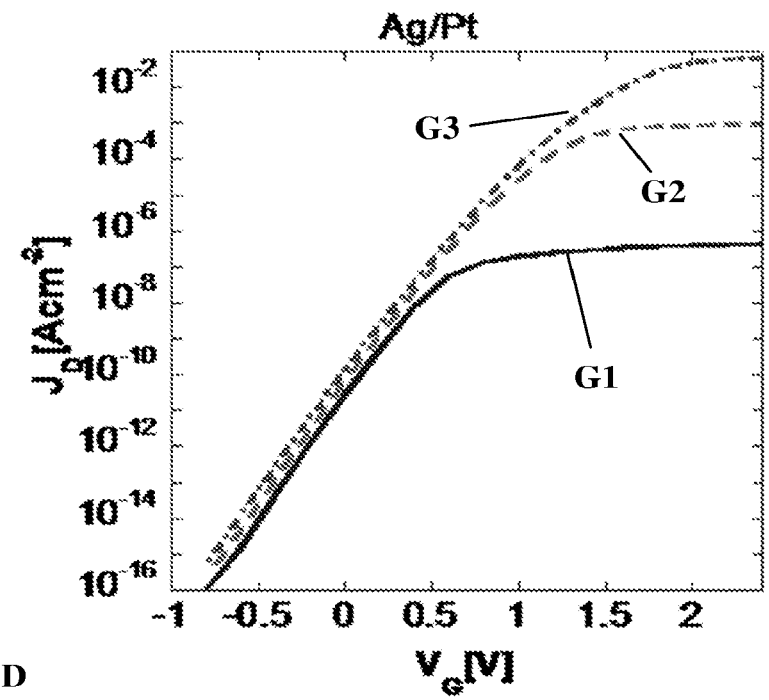

Reference is made to FIGS. 5A-5D showing simulated charge transfer characteristics in a transistor structure having a conventional two layered source electrode and a structure source electrode according to the present invention. FIGS. 5A-5C show current density $J_p$ along the semiconductor element 140 with respect to gate voltage $V_G$. FIGS. 5A and 5B show respectively transfer properties of Gold (Au)/Platinum (PT) layered source electrode having a flat face structure as illustrated in FIG. 1 and having a step-source electrode structure as illustrated in FIG. 2A; FIGS. 5B and 5C show such transfer properties for Silver (Ag)/Platinum (Pt) layered source electrode having flat-face structure and step-source structure. Each of these graphs shows three measured plot line G1-G3 for drain electrode bias of 1V, 2V and 3V respectively.

In these figures, the Gold (Au) or Silver (Ag) are used as the materials having low barrier for charge injection, and thus are used at the bottom portion 120A of the electrode structure 120. This is while Platinum (Pt) is used as the low injection material (high barrier) and is thus used for the top portion 120B of the electrode structure 120. Additionally, as shown, the use of step-source geometry exhibits higher barrier for current flow through the transistor under similar voltage conditions. Additional comparison is presented in FIG. 6, showing plot G1 and G3 from FIGS. 5C and 5D on the same graph. More specifically, FIG. 6 shows plots G1A and G1B respectively measuring current density as a result of gate voltage for flat and step-source structures of Silver/Platinum electrode under source-drain voltage of 1V; and similar plots G3A and G3B under source-drain voltage of 3V. As can be seen, increasing the source-drain voltage from 1V to 3V increases the current for zero gate voltage for flat face geometry (G1A and G3A), but not for the step-source geometry (G1B and G3B). Additionally, for the higher source-drain voltage, the electrode structure of the present invention (step-source geometry), due to its modified injection properties, requires higher gate voltage (2V) to reach its maximal current while the conventional electrode reaches the maximal current at gate voltage of 1V. Thus, the electrode structure of the present invention provides higher ON/OFF voltage ratio and potentially also higher gate bias to reach its maximal current density output. This is similar to providing of lower injection properties material as the source electrode, or providing the source electrode with higher barrier for charge injection. It should be noted however, that unlike the case of changing the source material, the use of an electrode structure according to the present invention for injection properties' tuning eliminates, or at least significantly reduces penalty in the maximum current supported by the electronic device.

The tilted-face geometry of the electrode structure, exemplified in FIG. 2B provides substantially similar current density dependence with respect to the source-drain voltage and the gate voltage. This is exemplified in FIGS. 7A and 7B showing similar measure results for gold/platinum and silver/platinum source electrode having a tilted-face edge structure. As shown, for higher source-drain voltage, the transistor structure requires higher gate voltage to reach its maximal current density and thus provides higher ON/OFF voltage ratios with respect to the conventional flat-face electrode geometry.

In this connection it should be noted that the electrode structure according to the present invention may be configured for operation is transmission of charge carriers being either electrons ($e^-$) or holes ($h^+$). Additionally, the electrode portions of the first and second groups are generally selected in accordance with preferred charge carriers to be transmitted by the electronic device. To this end, for electrode structure configured for transmission of electrons through semiconducting element (utilizing the LUMO level thereof), the material of the electrode portions of the first groups (i.e. having low barrier for charge injection) may be selected from the following list of materials: Li, Ca, Mg, Al, Ag, ZnO and Au. Additionally, the electrode portions of the second group (having higher barrier for charge injection) may be configured of a material selected from the following list of materials: Al, Ag, Au, MoO3, Pt and Se. For the electrode structure, configured for transmission of holes (electron vacancies) through the semiconductor element (utilizing the HOMO level thereof), the material for electrode portions of the first group may be selected from the following list of materials: Al, Ag, Au, MoO3, Pt and Se. In this configuration, the electrode portion of the second group may be made from any one of the following materials: Li, Ca, Mg, Al, Ag, ZnO and Au. It can be appreciated that generally, the materials suitable for use for electrode portions of the first and/or second groups may be replaced if the electrode is configure for transmission of electrons or holes through the corresponding levels of the semiconductor element. The portions of the electrode of the first or second group may be a combination of metals and may be provide with additional layers to optimize materials' compatibility along with injection properties. It should be noted that additional material may be used, although not specifically described herein.

Generally the transistor structure as described above may be produced in any lithography method. Additionally various printing methods may be used to produce the transistor structure of the present inventions. For example, the structure, or at least one or more layers thereof, may be produced by injection printing method.

Thus, the present invention provides novel electrode structure, suitable for use in electronic devices such as transistor structure (e.g. vertical type transistor structure, thin film transistor etc.), as semiconductor diode or any other suitable electronic device. The electrode structure is configured to provide a physical pattern providing an effective barrier for charge carriers' passage through the device. Thereby enabling control over device properties which is significantly higher than by material selection. Those skilled in the art will readily appreciate that various modifications and changes can be applied to the embodiments of the invention as hereinbefore described without departing from its scope defined in and by the appended claims.

The invention claimed is:

1. A transistor structure configured as a vertical type transistor and comprising a patterned electrode located between a gate electrode and a channel region of the transistor structure, the patterned electrode comprises one or more regions of discontinuity of said electrode, said patterned source electrode comprises at least first and second layers having at least first and second charge injection properties respectively for injection of charge carriers into the channel region, the patterned electrode is configured such that the second layer has a higher barrier for injection of charge carriers as compared to charge injection properties of the first layer;

wherein said one or more regions of discontinuity of said patterned electrode are configured such that the second layer of the patterned electrode skirts over edges of the first layer of said patterned electrode at edges of said regions of discontinuity.

2. The transistor structure of claim 1, wherein said patterned electrode is a source electrode of the transistor structure.

3. The transistor structure of claim 1, wherein said patterned electrode is configured as a two layered electrode.

4. The transistor structure of claim 1, wherein said patterned electrode is configured as a multi layered electrode, comprising at least two layers of conducting materials.

5. The transistor structure of claim 1, wherein said one or more regions of discontinuity of the patterned electrode are regions of discontinuity in electrical conductivity along said patterned electrode.

6. The transistor structure of claim 1, wherein said one or more regions of discontinuity of the patterned electrode being configured as one or more holes along surface of the electrodes, thereby allowing penetration of electric field generated by the gate electrode into the channel region.

7. The transistor structure of claim 1, wherein at least one of the first and second layers is configured as a multi-layered structure, said multi layered structure comprising at least two of a conducting layer, a semiconducting layer, and an insulating layer.

8. The transistor structure of claim 1, wherein at least one region of the second layer of the patterned electrode covers the first layer.

9. The transistor structure of claim 1, wherein the patterned electrode is configured to have at least one of the following configurations: step-source edge geometry, tilted edge geometry and curved edge geometry in at least one of said one or more regions of discontinuity.

10. The transistor structure of claim 1, wherein the first layer comprises a conducting material selected from: Li, Ca, Mg, Al, Ag, ZnO, Au, and the second layer comprises a conductive material selected from: Al, Ag, Au, $MoO_3$, Pt and Se.

11. The transistor structure of claim 1, wherein the first layer comprises a conducting material selected from: Al, Ag, Au, MoO$_3$, Pt, Se, and the second layer comprises a conductive material selected from: Li, Ca, Mg, Al, Ag, ZnO and Au.

12. The transistor structure of claim 1, wherein the first and second layers of said patterned electrode are configured with electronically conductive materials having selected first and second charge injection properties.

* * * * *

UNITED STATES PATENT AND TRADEMARK OFFICE
CERTIFICATE OF CORRECTION

PATENT NO. : 10,497,789 B2
APPLICATION NO. : 15/936513
DATED : December 3, 2019
INVENTOR(S) : Nir Tessler et al.

Page 1 of 1

It is certified that error appears in the above-identified patent and that said Letters Patent is hereby corrected as shown below:

On the Title Page

At item (30), delete "Dec. 20, 2013" and insert --Dec. 8, 2013--.

Signed and Sealed this
Fourth Day of August, 2020

Andrei Iancu
*Director of the United States Patent and Trademark Office*